United States Patent
Sorensen et al.

(10) Patent No.: US 7,518,466 B2
(45) Date of Patent: Apr. 14, 2009

(54) METHODS AND APPARATUS FOR SYMMETRICAL AND/OR CONCENTRIC RADIO FREQUENCY MATCHING NETWORKS

(75) Inventors: Carl Sorensen, Morgan Hill, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 211 days.

(21) Appl. No.: 11/507,649

(22) Filed: Aug. 21, 2006

(65) Prior Publication Data
US 2007/0046391 A1    Mar. 1, 2007

Related U.S. Application Data

(60) Provisional application No. 60/712,190, filed on Aug. 29, 2005.

(51) Int. Cl.
*H03H 7/38* (2006.01)
(52) U.S. Cl. ........................... 333/32; 333/34; 333/17.3
(58) Field of Classification Search ................ 333/17.3, 333/32, 99 PL
See application file for complete search history.

(56) References Cited

U.S. PATENT DOCUMENTS

| | | | |
|---|---|---|---|
| 5,383,019 A | 1/1995 | Farrell et al. | |
| 6,621,372 B2 * | 9/2003 | Kondo et al. | 333/35 |
| 6,816,029 B2 * | 11/2004 | Choi et al. | 333/32 |
| 6,855,225 B1 | 2/2005 | Su et al. | |
| 2002/0130110 A1 | 9/2002 | Kwon et al. | |
| 2003/0057844 A1 | 3/2003 | Windhorn et al. | |

FOREIGN PATENT DOCUMENTS

| | | |
|---|---|---|
| EP | 0 825 712 A2 | 2/1998 |
| EP | 1 056 200 A1 | 11/2000 |
| EP | 1 237 189 A1 | 9/2002 |
| WO | WO 00/03415 A1 | 1/2000 |

* cited by examiner

*Primary Examiner*—Anh Q Tran
(74) *Attorney, Agent, or Firm*—Dugan & Dugan PC (57) ABSTRACT

Apparatus and methods are provided that are adapted to match the impedance of an electrical load to an impedance of an electrical signal generator. The invention includes providing a plurality of electrical components adapted to collectively match the impedance of the electrical load to the impedance of the electrical signal generator. The electrical components are arranged symmetrically and concentrically about an axis. Additionally, the invention may also include a first connector adapted to electrically couple the electrical signal generator to the electrical components. Additionally, the invention may also include a second connector adapted to electrically couple the load to the electrical components. Numerous other aspects are provided.

26 Claims, 5 Drawing Sheets

METHODS AND APPARATUS FOR SYMMETRICAL AND/OR CONCENTRIC RADIO FREQUENCY MATCHING NETWORKS

CROSS-REFERENCE TO RELATED APPLICATIONS

The present application claims priority to currently pending, commonly assigned, U.S. Provisional Patent Application Ser. No. 60/712,190 filed Aug. 29, 2005 and entitled "METHODS AND APPARATUS FOR SYMMETRICAL AND/OR CONCENTRIC RADIO FREQUENCY MATCHING NETWORKS," which is hereby incorporated herein by reference for all purposes.

FIELD OF THE INVENTION

The present invention relates generally to high or radio frequency matching networks and specifically to high powered matching networks for plasma processing chambers.

BACKGROUND OF THE INVENTION

Figure 1:
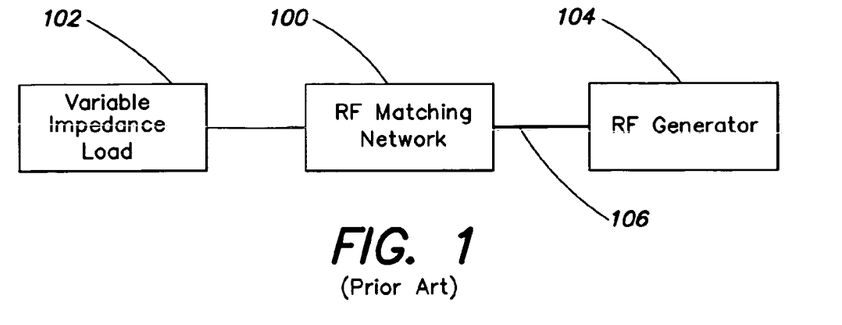
FIG. 1 is a block diagram of a prior art RF power system with an RF generator, an RF matching network, and a variable load.

Referring to FIG. 1, a plasma processing system may include a high or radio frequency (hereinafter referred to as 'RF') matching network 100, a variable impedance load (e.g. a plasma processing chamber) 102, an RF generator 104, and an RF delivery system 106. The RF matching network 100 is disposed between and electrically coupled to the RF delivery system 106 and the variable impedance load 102. The RF delivery system 106 is electrically coupled to the RF generator 104. The RF matching network 100 may include electrical components of known or variable impedance values (e.g., variable capacitors and/or inductors). The RF delivery system 106 may include items such as a high power coaxial cable assembly and connectors.

The RF generator 104 may provide RF energy to the variable impedance load 102 via the RF delivery system 106 and the RF matching network 100. The function of the RF matching network 100 may be to match the impedance of the variable impedance load 102 to the output impedance of the RF generator 104 and RF delivery system 106. By matching the impedance of the variable impedance load 102 to the output impedance of the RF generator 104 and the RF delivery system 106, the reflection of the RF energy from the variable impedance load 102 may be reduced. Reducing the reflection of RF energy may effectively increase the amount of RF energy provided to the variable impedance load 102 by the RF generator 104.

Figure 2:
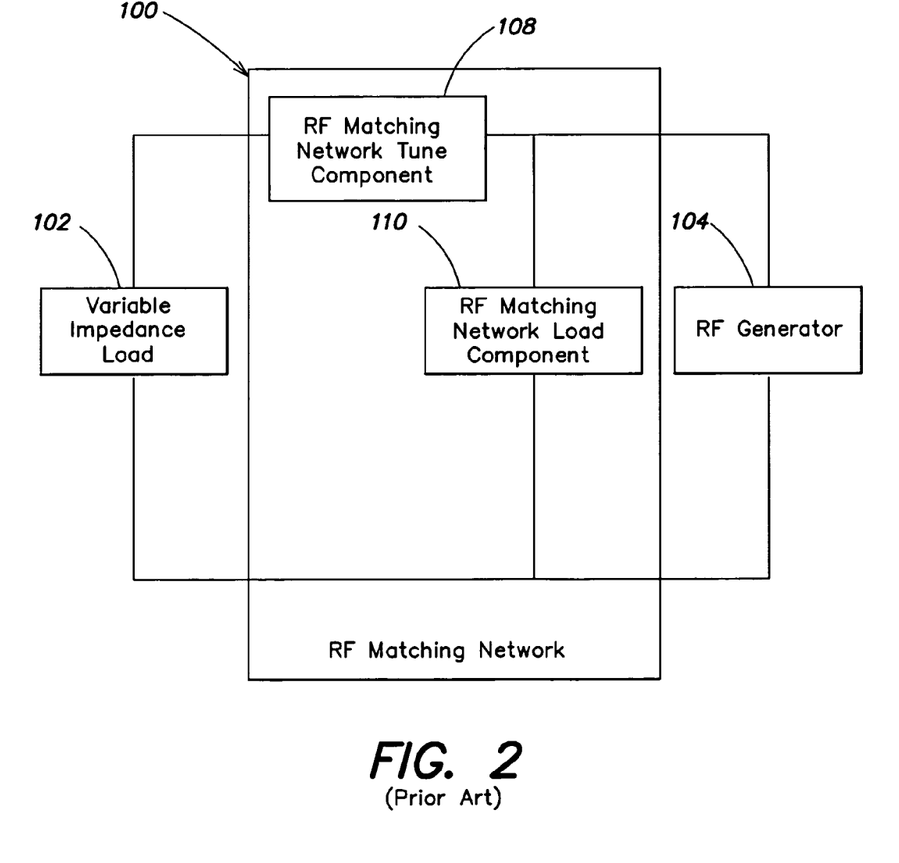
FIG. 2 is a schematic drawing illustrating details of the prior art RF matching network depicted in FIG. 1.

A first technique of RF matching may include varying the electrical impedance of the capacitors and/or inductors until the impedance of the variable impedance load matches the output impedance of the RF generator. FIG. 2 is a more detailed schematic drawing depicting the prior art RF matching network 100. The depiction shows the asymmetrical arrangements of a tune component 108 and a load component 110 of the RF matching network 100. In addition, RF matching networks 100 are typically asymmetrical in the arrangement of the tune 108 and load components 110.

A second technique of matching the impedance of the variable impedance load 102 to the impedance of the RF generator 104 may utilize variable frequency matching. The impedance presented by the RF matching network 100 to the output of the variable RF frequency generator 104 may change with the frequency. By outputting a particular frequency from the RF generator 104, the variable impedance load 102 may match the impedance of the RF generator 104 and the RF delivery system 106. This technique may be referred to as variable frequency matching. Variable frequency matching may employ the RF matching network 100 that includes fixed value tune components 108 and load components 110 (e.g. fixed value capacitors, inductors and/or resistors). The values of the tune components 108 and load components 110 may be selected to help ensure that the impedance of the RF generator 104 will match the impedance of the variable impedance load 102.

Prior art RF matching networks may help reduce the amount of energy reflected by the variable impedance load. However, the inventors of the present invention have determined that in some circumstances, existing RF matching networks may not reduce the amount of reflected energy sufficiently to avoid problems. Thus, what is needed are improved methods and apparatus for RF matching.

SUMMARY OF THE INVENTION

In some aspects, the present invention provides an apparatus adapted to match the impedance of an electrical load to an impedance of an electrical signal generator. The apparatus includes a plurality of electrical components adapted to collectively match the impedance of the electrical load to the impedance of the electrical signal generator. The electrical components are arranged symmetrically and concentrically about an axis. Additionally, the apparatus also includes a first connector adapted to electrically couple the electrical signal generator to the electrical components. The apparatus also includes a second connector adapted to electrically couple the load to the electrical components.

In another aspect, the invention provides a system, comprising an RF power generator, an electrical load, and an RF matching network coupled to the electrical load and the power generator, wherein the RF matching network includes one or more components symmetrically disposed about an axis.

In another aspect, the invention provides a method comprising receiving RF energy with a first connector having a first axis, coupling the RF energy from the first connector to an RF matching network having one or more components disposed symmetrically about a second axis, coupling the RF energy from the RF matching network to a second connector having a third axis, and preventing the reflection of RF energy from the second connector, wherein the first axis, the second axis and third axis substantially colinear.

Other features and aspects of the present invention will become more fully apparent from the following detailed description, the appended claims, and the accompanying drawings.

DETAILED DESCRIPTION

Substrates processed in plasma processing chambers are becoming larger. Thus, with each successive generation of technology, larger plasma processing chambers are being manufactured to accommodate the larger substrates. Due to the plasma processing chambers increasing in size, the power needed to perform the requisite processing steps (e.g., etch, deposition and/or implant) is increasing. The inventors of the present invention have determined that the increase in RF power needed may lead to localized excessive current densities within existing RF matching network designs and, subsequently, localized heating of the components and/or conductors (often referred to as 'hotspots') of existing RF matching network designs. Accordingly, an improved RF matching network is needed to prevent the formation the hotspots.

In accordance with the present invention, an inventive RF matching network that includes a fixed valued component or components is provided. The fixed value components are disposed in a symmetrical and/or concentric arrangement about a longitudinal axis. The symmetrical and/or concentric arrangement may include a single component that is fabricated in a concentric fashion. Alternatively, the symmetrical and/or concentric arrangement may include multiple fixed value components arranged in a similar manner. The efficiency of the matching network is improved by symmetrical and/or concentric arrangement about the longitudinal axis because the RF currents are distributed evenly about the components. This reduces the likelihood of hotspots, thereby allowing for fewer and less expensive components.

Figure 3:
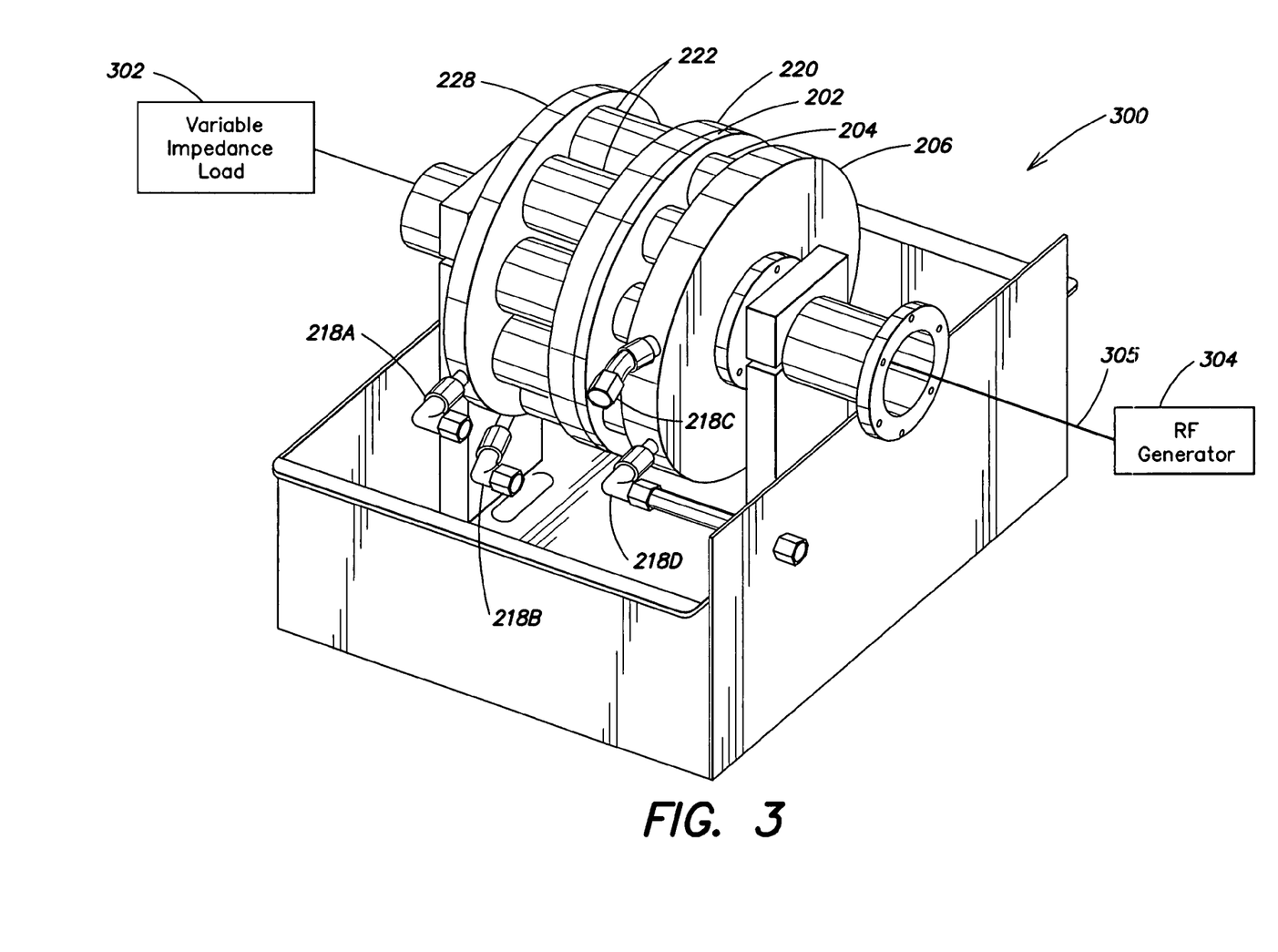
FIG. 3 is a perspective view of a first example embodiment of a symmetrical and/or concentric RF matching network according to some embodiments of the present invention.

Turning to FIG. 3, a perspective view of the inventive RF matching network 300 is depicted. The fixed valued components are disposed in a symmetrically and/or concentric arrangement. In this embodiment, fixed valued load capacitors 204 are disposed between and couple an input ground flange 206 and an input core 202. The input core 202 is coupled to a capacitor plate 220. An output disk 228 is coupled to a variable impedance load 302. Additionally, tune capacitors 222 are disposed between and couple the input core 202 and the output disk 228. The input core 202 is coupled to an electrically excited conductor of an RF delivery system 305. The input ground flange 206 is coupled to the grounded portion of the RF delivery system. Also depicted in this figure are coolant inputs and outputs that are coupled to external fluid channels 218A-D (only four of six shown).

Figure 4:
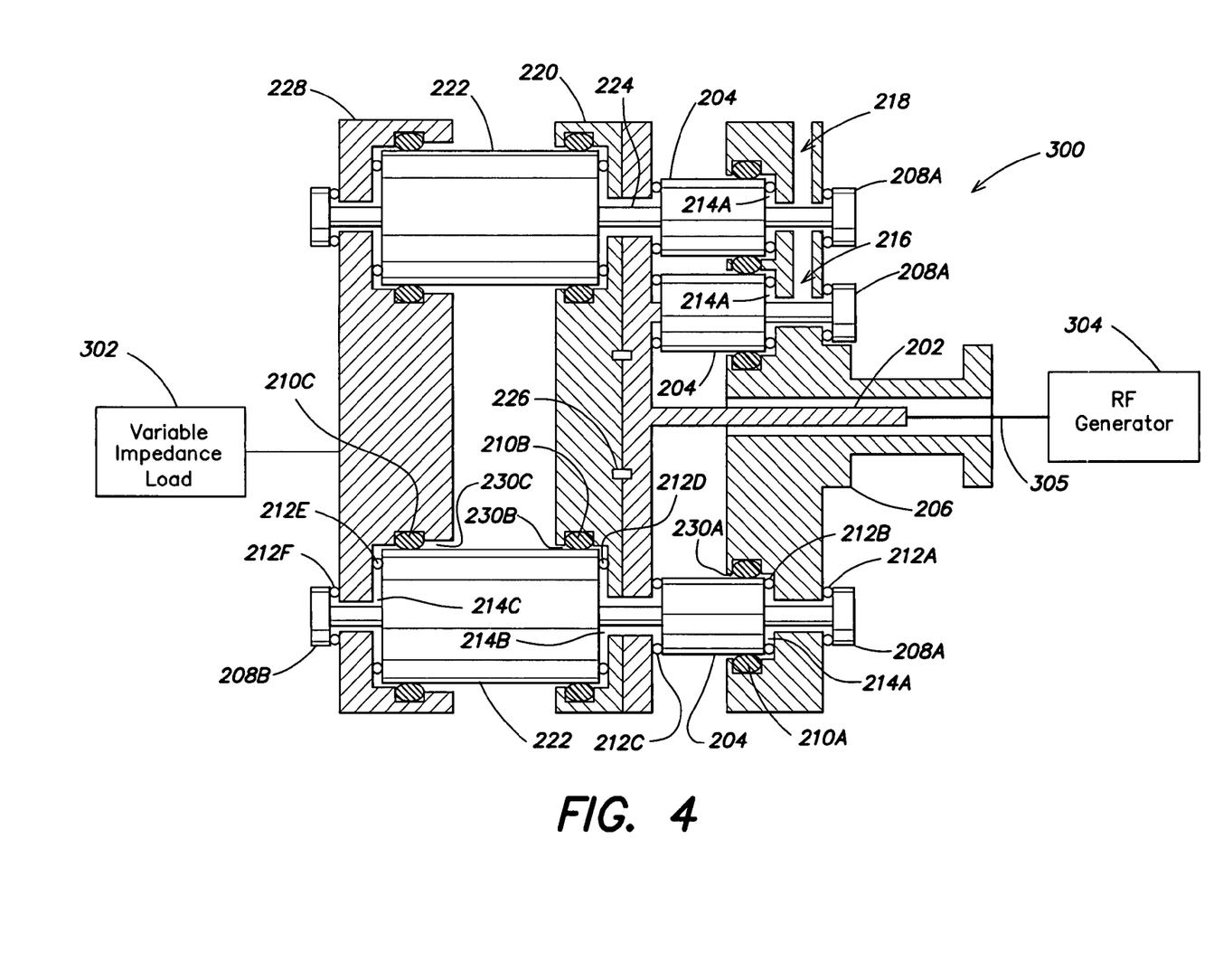
FIG. 4 is a drawing depicting a schematic view of the RF matching network of FIG. 3 according to some embodiments of the present invention.

Turning to FIG. 4, the details of the RF matching network of FIG. 3 are illustrated schematically. The input core 202 is connected to the RF generator 304 via the electrically excited conductor of the RF delivery system 305. The input core 202 is coupled to load capacitors 204 of the RF matching network 300. The load capacitors 204 are coupled to an input ground flange 206 using load capacitor bolts 208A. Disposed between the input ground flange 206 and the load capacitors 204 are concentric springs 210A that circumnavigate the load capacitors 204. Between the input ground flange 206 and the capacitor bolts 208A are o-rings 212A. Additionally, the o-rings 212B are interposed between the load capacitors 204 and the input ground flange 206. The o-rings 212A and 212B for each load capacitor 204 form a fluid reservoir 214A around each load capacitor 204. The fluid reservoirs 214A are connected to each other via fluid channels 216 (only one shown). Additionally, at least two of the reservoirs 214A (one input and one output) are connected to an external source of fluid (not shown) via external fluid channels 218 (only one shown). Furthermore, a capacitor plate 220 and output disk 228 also include fluid channels 216 and external fluid channels 218 in this embodiment.

The input core 202 is additionally coupled to the capacitor plate 220. The input core 202 is coupled to the tune capacitor plate 220 via the compressive force of the threaded bolts 224 screwed into both the load capacitors 204 and tune capacitors 222. The coupling of the input core 202 to the capacitor plate 220 is aided by alignment pins 226. The capacitor plate 220 is also coupled to the tune capacitors 222 via the concentric springs 210B. Additionally, interposed between the tune capacitors 222 and the capacitor plate 220 are the o-rings 212D. As before, the o-rings 212D disposed between the tune capacitors 222 and the capacitor plate 220 in addition to the o-rings 212C between the load capacitors 204 and the input core 202 form fluid reservoirs 214B around each tune capacitor 222. The tune capacitors 222 are coupled to the output disk 228 via the bolts 208B. As before, the o-rings 212E interposed between the tune capacitors 222 and output disk 228, in addition to the o-rings 212F interposed between the bolts 208 and the output ring 228, form fluid reservoirs 214C around the end of each tune capacitor 222. The tune capacitors 222 are also coupled to the output disk 228 via the concentric springs 210C. Additionally, the output disk 228 is coupled to the variable impedance load 302 (e.g., the processing chamber).

In a first aspect of the invention, the novel RF matching circuit 300, in a symmetrical and/or concentric configuration, is provided for a variable frequency network. In this embodiment, the tune capacitors 222 and load capacitors 204 are arranged in a symmetrical and/or concentric configuration. The tune capacitors 222 and load capacitors 204 are fixed capacitors arranged in an electrical circuit composing an RF matching circuit 300. The tune capacitors 222 are in series with the variable impedance load. The load capacitors 204 are in parallel with the variable impedance load to be matched to the impedance of the RF generator. In this embodiment, the RF current is supplied via the core conductor of the coaxial cable to the input core 202 of the novel RF matching network 300. The input core 202 may be employed as a first connector for the RF matching network 300. The longitudinal axis of the input core 202 is located approximately collinear to the longitudinal axis of the RF matching circuit 300 to facilitate the symmetrical and/or concentric arrangement of the RF matching network tune capacitors 222 and load capacitors 204. The input core 202 includes a rod and disk that are electrically coupled to a plurality of tune capacitors 222 and load capacitors 204. The load capacitors 204, being the high frequency coupling to earth ground, are arranged in a symmetrical and/or concentric configuration to 'double back' to the input ground flange 206, thereby forming the electrical coupling to ground. The input ground flange 206 is held to be at or close to electrical earth ground by electrical coupling to the RF delivery system. This symmetrical and/or concentric 'double back' configuration is accomplished by placing the equal capacitive value load capacitors 204 in an equidistant fashion around the axis of the RF matching network 300. Electrically, the load capacitors 204 are in parallel thus creating an electrically equivalent lumped capacitance value that may be used in approximate circuit analysis. The lumped value capacitance is an approximation and may be subjected to electromagnetic frequency and time domain analysis for a complete analysis of the electrical characteristic of the design. Alternatively, in some applications that would benefit from a different arrangement of load or tune components, there may be resistors and/or inductors arranged in place of, in series with or in parallel with the load capacitors 204 and/or tune capacitors 222. Different physical arrangements may alternatively be used for a symmetrical and/or concentric arrangement such as, for example, an inductor alternating concentrically with the capacitors or an inner ring of resistors surrounded by inductors or capacitors. In some embodiments, a single capacitor, inductor or resistor may be formed or manufactured in a symmetrical and/or concentric fashion to create symmetrical and/or concentric arrangement of the passive components and/or resistor, capacitor and inductor. Additionally, various combinations of the symmetrical and/or concentric configuration of fixed and variable components may be employed with or without the variable frequency generator to create an optimal solution for different applications of the RF matching network 300. For example, there may be benefit from combining variable capacitors and/or inductors in combination with a variable frequency generator to allow for a single matching network to be used on multiple different processes or chambers that do not have similar impedance characteristics. Generally, variable frequency matching networks are used with loads that are approximately stable. Variable components may be employed in applications that have a wider window of impedance. Note that the that symmetrical and/or concentric arrangement of the components may not be limited to matching networks, but may be applied to any circuit that would benefit from the symmetrical and/or concentric configuration of the components. In some embodiments, employment of active components such as diodes or transistors may be used in high power amplifier networks.

Returning to the embodiment of FIG. 4, the symmetrical and/or concentric configuration of the tune capacitors 222 and load capacitors 204 is facilitated by the use of disk shaped mating surfaces that comprise the input core 202 and input ground flange 206. These disk shaped mating surfaces may be flat and thick enough to both dissipate heat and accommodate dishes that are created to further facilitate cooling, as discussed below. However, additional embodiments may include other support structure arrangements such as a hub and spoke form that facilitate, for example, fluid being circulated around the tune capacitors 222 and load capacitors 204. Additionally, for applications that would benefit from a thinner and/or longer structure, support structures may be employed that arrange the components that are in a symmetrical and/or concentric configuration, but asymmetrical along the axis of the RF matching network 300.

Additionally, in the embodiment of FIG. 4, the load capacitors 204 are mechanically coupled on one end (e.g., the RF or hot end) to the input core 202 and input ground flange 206. The mechanical coupling or fastening is accomplished by placing a bolt 224, with an outside diameter appreciably smaller than the inside diameter of the hole in the input core 202 (e.g., such that there is no contact between the bolt 224 and the input core 202 or capacitor plate 220) through which the bolt is placed into the threaded hole on the load capacitor 204 and tune capacitor 222. In the alternative, other means of coupling or fastening may be employed such as welding, riveting and/or the like.

Additionally, in the embodiment of FIG. 4, the electrical coupling of the load capacitors 204 and the tune capacitors 222 to the input ground flange 206 and the capacitor plate 220 may be accomplished by placing canted coil springs 210A-C into hollowed out dishes 230A-C in the input core 202, output disk 228, and/or the capacitor plate 220. The dishes 230A-C provide mechanically stable platforms with which to place the circumnavigated canted coil springs 210A-C and the capacitors 204, 222 to ensure a centered configuration of the capacitors 204,222. Additionally, the dishes 230A-C create a concentric and reliable electrical connection between the load capacitors 204, the tune capacitors 222, the capacitor plate 220 and the input core 202, thereby forming an electrical node. Additionally, the dishes 230A-C may provide a hollowed out feature that allow o-rings 212A-F placed therein to define a volume that forms the fluid reservoirs 214A-C to cool the load capacitors 204 and the tune capacitors 222, as discussed below. The arrangement and size of the dishes 230A-C depend on the arrangement and size of the load capacitors 204 and tune capacitors 222 and other components that create the electrical and mechanical coupling.

As indicated above, in the embodiment of FIG. 4, arrangements may be provided to cool the RF matching circuit 300 to prevent any overheating which may occur. Cooling may be provided by forming the fluid reservoirs 214A with the body of the bolts 208A, load capacitors 204, the dish 230A and the o-rings 212A and 212B. The o-rings 212A and 212B are arranged concentrically around the shaft of the bolt and capacitor. By tightening the bolts 208A, the o-rings 212A and 212B are thereby compressed to form a fluid seal. Because the outside diameter of the bolts 208A are sized to be appreciably smaller than the through hole of the input ground flange 206 or input core 202, the fluid reservoir 214A is formed. In addition, the ends of the tune capacitors 222 and load capacitors 204 may offer additional volume for fluid circulation by providing a dish on each end of the capacitor. Alternatively, the o-rings 212A-F may be situated in a groove formed to hold the o-ring in place while the bolt is being tightened. Other forms of sealing such as flat chemrez o-rings, nickel-brass single compression disk or other such embodiments may be employed to form the seal. The fluid reservoirs 214A around each load cap 204 are in fluid communication with each other via fluid channels 216 that may be machined or otherwise formed into the input ground flange. The fluid channels 216 are arranged to communicate between each of the fluid reservoirs 214A, 214B or 214C to ensure that cooling fluid is applied, equally, to all of the capacitors to prevent the formation of hotspots. The arrangement in this embodiment is a concentric loop of fluid channels 216 connecting all of the fluid reservoirs 214A or 214B or 214C. Alternative arrangements may be implemented such as a spoke and wheel arrangement of fluid channels, or other communication channels external to the input core or input ground flange such as copper tubing connecting each fluid reservoir or set of reservoirs. Alternatively, the fluid reservoirs may be replaced by a cooling loop arranged in a concentric and/or symmetrical fashion which may be attached to the input core 202 and input ground flange 206. Such an embodiment may reduce the cost of the matching assembly via the use of techniques such as soldering, glue or other such connection and/or adhesion methods. Alternatively, a combination of a hub and spoke construction of the input core 202 and input ground flange 206 may be employed with forced air or other uncontained fluid immersion to cool the RF matching circuit 300, thereby reducing costs. Various combinations of contained and uncontained fluids may be employed to optimize the compromise between costs and design goals. De-ionized water is employed as the cooling fluid. However, other fluids may be employed. De-ionized water may be selected because of its high impedance to ground to ensure that the electrically energized portions of the circuit remain electrically decoupled, via the fluid communication, from the grounds such as the input ground flange 206.

Still referring to the embodiment of FIG. 4, the load capacitors 204 and tune capacitors 222 are attached to each other with threaded bolts 224. The outside diameter of the threaded bolts 224 are appreciably smaller than the inside diameter of the holes in the capacitor plate 220 and input core 202 through which the stud is placed. By threading the threaded bolts 224 into one end of the load capacitors 204 through the holes in the input core 202 and the capacitor plate 220 and subsequently threading the tune capacitors 222 onto other end of the threaded bolts 224 the capacitor plate 220 and input core 202 are mechanically coupled to the tune capacitors 222 and load capacitors 204. The electrical connection between the tune capacitors 222, load capacitors 204, the capacitor plate 220 and input core 202 may be considered a single electrical node that is 'hot' or 'energized' with RF energy.

Still referring to the embodiment of FIG. 4, the output disk 228 is coupled to the tune capacitors 222. As with the mechanical coupling mentioned herein, the output disk 228 is mechanically coupled to the tune capacitors 222 via the threaded bolts 208B that are arranged in a fashion similar to the arrangement described above pertaining to the capacitor plate 220 and input core 202. The output disk 228 may be employed as a second connector for the RF matching network 300. A longitudinal axis of the output disk 228 may be approximately collinear with the longitudinal axis of the RF matching network 300. Additionally, the output disk 228 may be formed to create fluid reservoirs 214C, channels similar to channels 216 and/or source channels similar to channel 218 in a similar fashion to the input core 202 and the capacitor plate 220. The alternatives for cooling and electrical connection, as described above for the capacitor plate 220 and input core 202, may also be applied to the output disk 228.

The electrical connection to the process chamber may be accomplished via a bus bar 229 (FIG. 5) that extends to couple to the variable impedance load 302 (e.g., the interior of the chamber). Other connective means may be employed such as a coaxial connection to a coaxial cable or simple copper cable bolted to the output disk 228. Because the output disk 228 is connected to the variable impedance load 302, there may not be a need to maintain a symmetrical shape to provide electrical symmetry as is useful on the RF generator side of the RF matching network 300. However, the method of connection to the output disk 228 may be robust such as to provide for a large contact surface and tight fastening since the current path to the processing chamber is limited to passing through this connector. Additionally, a method of cooling this connection may be provided.

Figure 5:
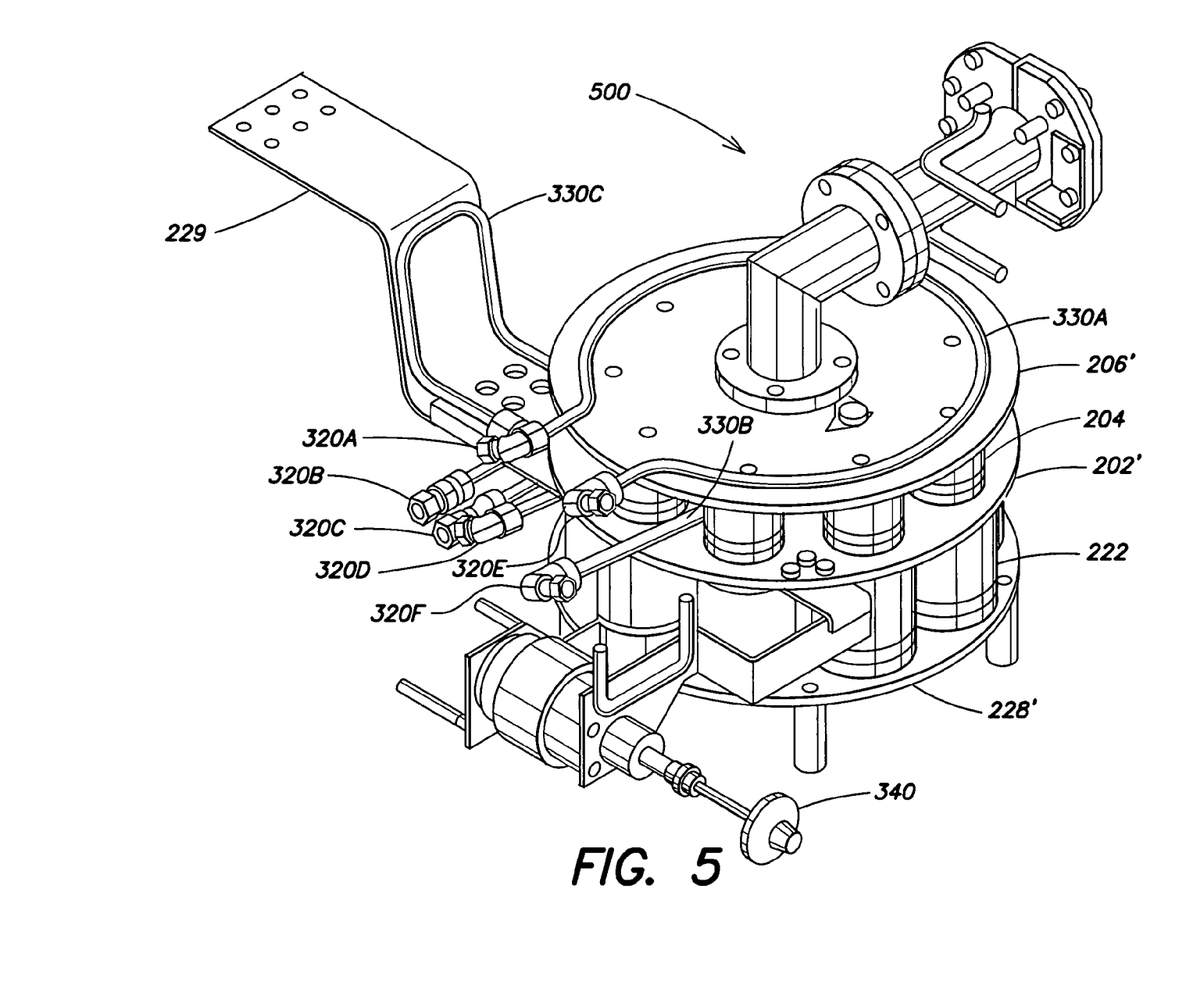
FIG. 5 is a perspective view of a second example embodiment of a symmetrical and/or concentric matching network according to some embodiments of the present invention.
Figure 6:
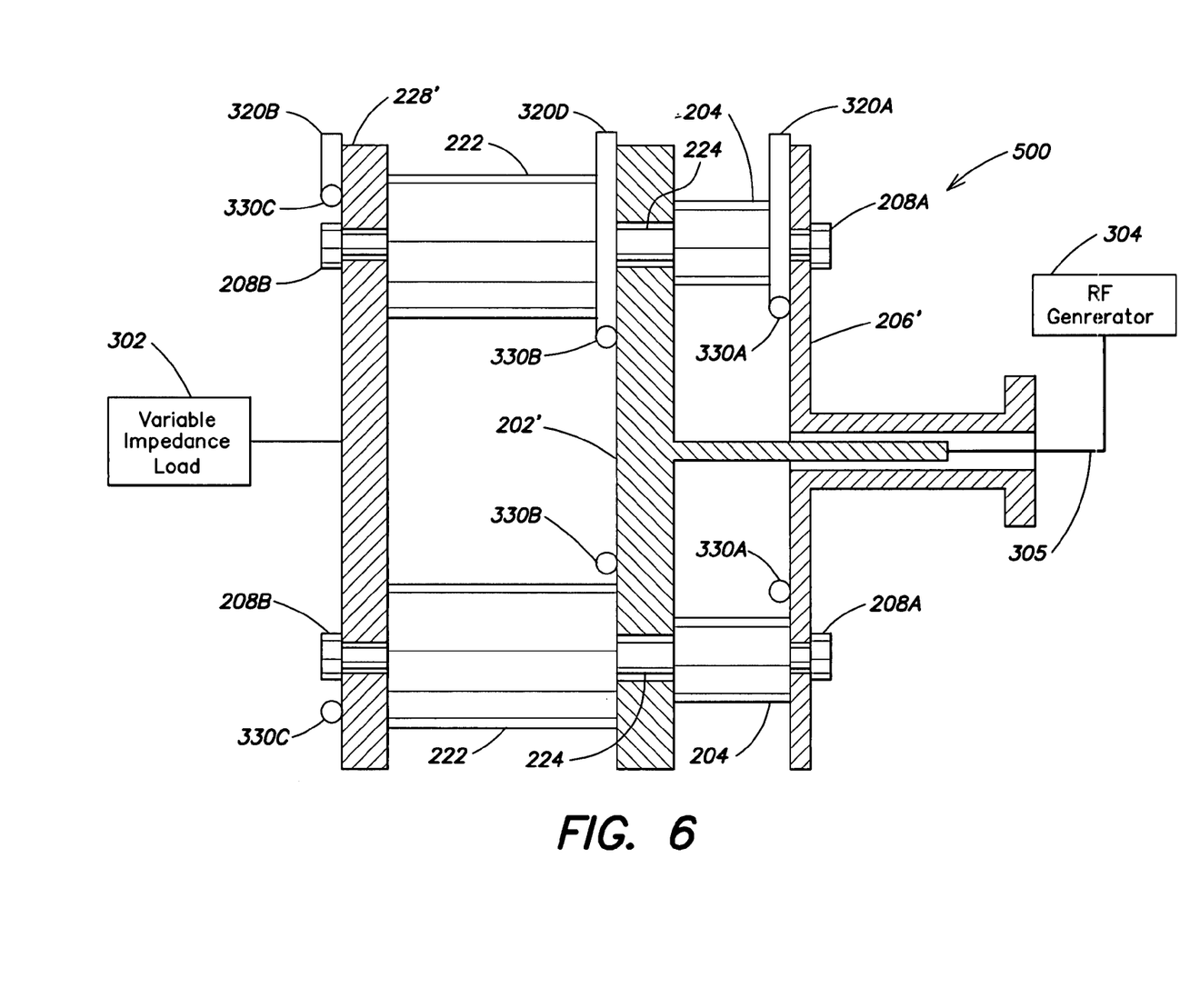
FIG. 6 is a drawing depicting a schematic view of the RF matching network of FIG. 5 according to some embodiments of the present invention.

Turning to FIGS. 5 & 6, a second embodiment of an RF matching network 500 is depicted. The internal conductor of the RF delivery system 305 is coupled to the input core 202'. The input core 202' is coupled to the load capacitors 204 with threaded bolts 224 (FIG. 6). The input core 202' is also coupled to the tune capacitors 222 via threaded bolts 224 (FIG. 6). The input core 202' includes a copper coil 330B that provides cooling for the input core 202'. The load capacitors 204 are connected to the input ground flange 206' via bolts 208A (FIG. 6). The input ground flange 206' may be at or near electrical earth ground by coupling directly to ground or via the grounded connector of the RF delivery system. The tune capacitors 222 are connected to the output disk 228' via bolts 208B. The output disk 228' may be electrically energized and conduct the RF current from the RF matching network 500 to the variable impedance load via a bus bar 229.

Referring specifically to FIG. 6, a schematic representation of the second embodiment of FIG. 5 is depicted. The input core 202' is shown connected to the energized conductor of the RF delivery system 305. The input core 202' is connected to the load capacitors 204 via threaded bolts 224. The load capacitors 204 are coupled to the input ground flange 206' via the bolts 208B. The input core 202 is coupled to the tune capacitors 222 via threaded bolts 224. The tune capacitors 222 are coupled to the output disk 228' via bolts 208B. The output disk 228 is coupled to the variable impedance load (e.g. the processing chamber) via a bus bar connection 229 (FIG. 5).

In the embodiment of FIGS. 5 and 6, an input ground flange cooling loop 330A may be coupled to the input ground flange 206' by, for example, soldering the input ground flange cooling loop 330A to the input ground flange 206'. Likewise an input core cooling loop 330B may be coupled to the input core 202' by using solder. Additionally, an output cooling loop 330C may be coupled to the output disk 228' by using solder. The input ground flange cooling loop 330A, the input core cooling loop 330B and output disk cooling loop 330C may be connected to an external source of cooling fluid (e.g. de-ionized water). Each may be independently connected to a source and drain of cooling fluid (e.g. de-ionized water) via two connectors for each cooling loop. The input ground flange cooling loop 330A may be connected with connectors 320A and 320E. The input core cooling loop 330B may be connected with connectors 320F and 320D, and the output disk cooling 330C may be connected with connectors 320B and 320C. One of the two connectors in the connector pairs is for the supply of the cooling fluid. The second connector is for the return of the cooling fluid. Thereby, fluid may be circulated through each the input ground flange cooling loop 330A, input core cooling loop 330B, and output disk cooling loop 330C. In this example embodiment, the material used for the input ground flange cooling loop 330A, input core cooling loop 330B and output disk cooling loop 330C may be copper. However, any practicable materials may be used to provide a contained path through which the cooling fluid may circulate. Such materials may include, for example, stainless steel or aluminum. Additionally, different materials and geometries may be employed in the cooling loop such as an array of tubes or a sandwich grid of holes in a machined surface.

Accordingly, while the present invention has been disclosed in connection with exemplary embodiments thereof, it should be understood that other embodiments may fall within the spirit and scope of the invention, as defined by the following claims.

The invention claimed is:

1. An apparatus, comprising:
    a first connector having a first longitudinal axis;
    a second connector having a second longitudinal axis; and
    a component assembly including one or more components,
        wherein at least one of the components is coupled to the first connector and at least one of the components is coupled to the second connector,
        wherein the one or more components are disposed symmetrically about a third axis; and
        wherein the component assembly includes one or more components disposed to reduce the formation of current hot spots.

2. The apparatus of claim 1, wherein the third axis is substantially collinear with the first longitudinal axis and the second longitudinal axis.

3. The apparatus of claim 1, wherein the one or more components are disposed concentrically about the third axis.

4. The apparatus of claim 1, wherein the one or more components are disposed equidistant about the third axis.

5. The apparatus of claim 1, wherein the components are tune and load components of an RF matching network.

6. The apparatus of claim 1, wherein at least one of the one or more components is a capacitor.

7. The apparatus of claim 1, wherein at least one of the one or more components is an inductor.

8. The apparatus of claim 1, wherein at least one of the one or more components is a resistor.

9. The apparatus of claim 1, wherein at least one of the one or more components are variable impedance components.

10. The apparatus of claim 1, wherein the component assembly includes one or more components disposed to prevent the formation of current hot spots.

11. A system, comprising:
an RF power generator;
an electrical load; and
an RF matching network coupled to the electrical load and the power generator,
wherein the RF matching network includes one or more components symmetrically disposed about an axis; and
wherein the RF matching network includes one or more components disposed to reduce the formation of current hot spots.

12. The system of claim 11, wherein the one or more components are disposed concentrically about the axis.

13. The system of claim 11, wherein the one or more components are disposed equidistant about the axis.

14. The system of claim 11, wherein the one or more components are tune and load components of the RF matching network.

15. The system of claim 11, wherein at least one of the one or more components is a capacitor.

16. The system of claim 11, wherein at least one of the one or more components is an inductor.

17. The system of claim 11, wherein at least one of the one or more components is a resistor.

18. The system of claim 11, wherein at least one of the one or more components are variable impedance components.

19. The system of claim 11, wherein the RF matching network includes one or more components disposed to prevent the formation of current hot spots.

20. A method, comprising:
receiving RF energy at a first connector having a first axis;
coupling the RF energy received at the first connector to an RF matching network having one or more components disposed symmetrically about a second axis;
coupling the RF energy in the RF matching network to a second connector having a third axis; and
preventing reflection of the RF energy by the second connector.

21. The method of claim 20 wherein preventing reflection of the RF energy includes aligning the first axis, the second axis and third axis in a substantially collinear arrangement.

22. The method of claim 20, wherein preventing the reflection of RF energy from the second connector includes varying the frequency of the RF energy.

23. The method of claim 20, wherein preventing the reflection of RF energy from the second connector includes varying an impedance of at least one of the one or more components.

24. The method of claim 20, wherein coupling the RF energy at the first connector to an RF matching network having one or more components disposed symmetrically about a second axis includes preventing the formation of hot spots.

25. The method of claim 20, wherein coupling the RF energy in the RF matching network to the second connector includes preventing the formation of hot spots.

26. A method, comprising:
receiving RF energy at a first connector having a first axis;
coupling the RF energy received at the first connector to an RF matching network having one or more components disposed symmetrically about a second axis;
coupling the RF energy in the RF matching network to a second connector having a third axis; and
reducing reflection of the RF energy by the second connector.

* * * * *